(12) United States Patent
Meyer et al.

(10) Patent No.: US 11,411,146 B2
(45) Date of Patent: Aug. 9, 2022

(54) PROTECTION LAYER FOR A LIGHT EMITTING DIODE

(71) Applicant: LUMILEDS LLC, San Jose, CA (US)

(72) Inventors: Jens Meyer, Aachen (DE); Marinus Johannes Petrus Maria van Gerwen, Aachen (DE); Ronja Missong, Aachen (DE); Joerg Feldmann, Aachen (DE); Hans-Helmut Bechtel, Aachen (DE)

(73) Assignee: Lumileds LLC, San Jose, CA (US)

( * ) Notice: Subject to any disclaimer, the term of this patent is extended or adjusted under 35 U.S.C. 154(b) by 93 days.

(21) Appl. No.: 17/066,278

(22) Filed: Oct. 8, 2020

(65) Prior Publication Data

US 2022/0115566 A1    Apr. 14, 2022

(51) Int. Cl.
*H01L 33/50*  (2010.01)
*H01L 27/15*  (2006.01)

(52) U.S. Cl.
CPC .......... *H01L 33/502* (2013.01); *H01L 27/156* (2013.01); *H01L 2933/0041* (2013.01); *H01L 2933/0091* (2013.01)

(58) Field of Classification Search
CPC ................. H01L 33/502; H01L 27/156; H01L 2933/0041; H01L 2933/0091
See application file for complete search history.

(56) References Cited

U.S. PATENT DOCUMENTS

| | | | |
|---|---|---|---|
| 7,521,862 B2 | 4/2009 | Mueller et al. | |
| 7,554,258 B2 | 6/2009 | Rossner et al. | |
| 8,721,098 B2 | 5/2014 | Bechtel et al. | |
| 8,994,259 B2 * | 3/2015 | Tamaki | H01L 33/502 427/64 |
| 9,033,531 B2 | 5/2015 | Ravilisetty et al. | |

(Continued)

FOREIGN PATENT DOCUMENTS

| | | | |
|---|---|---|---|
| EP | 2645433 A2 | 10/2013 | |
| EP | 2645433 A3 | 1/2016 | |

(Continued)

OTHER PUBLICATIONS

From the Korean Intellectual Property Office as the ISR, "Notification of the International Search Report and the Written Opinion of the International Searching Authority, or the Declaration", PCT/US2021/050219, dated Jan. 3, 2022, 8 pages.

*Primary Examiner* — Jonathan Han

(57) ABSTRACT

A particle layer is positioned over a light output surface of a light emitting diode. A transparent protection layer positioned between and in contact with the light output surface and the particle layer. The particle layer comprises a multitude of optically scattering or luminescent particles and a thin coating layer of transparent material coating particles of the multitude. The particles are characterized by a D50 greater than about 1.0 μm and less than about 30. μm; the coating layer has a thickness less than about 0.20 μm. The protection layer is less than about 0.05 μm thick and includes one or more materials different from material of the coating layer. The protection and coating layers can each include one or more metal or semiconductor oxides. Oxide precursor reactivities, with respect to the corresponding light output surface, are less for protection layer material than for coating layer material.

20 Claims, 9 Drawing Sheets

(56) References Cited

U.S. PATENT DOCUMENTS

| | | |
|---|---|---|
| 9,865,577 B2 | 1/2018 | Bibl et al. |
| 10,290,775 B2 | 5/2019 | Mueller et al. |
| 2005/0093008 A1 | 5/2005 | Suehiro et al. |
| 2007/0298250 A1 | 12/2007 | Weimer et al. |
| 2008/0084150 A1 | 4/2008 | Cok |
| 2008/0121917 A1 | 5/2008 | Weisbuch et al. |
| 2012/0074835 A1 | 3/2012 | Piquette et al. |
| 2015/0255683 A1 | 9/2015 | Stoll et al. |
| 2016/0149097 A1* | 5/2016 | Saka .............. C23C 16/4417 428/143 |
| 2017/0235216 A1 | 8/2017 | Maeda et al. |
| 2018/0122993 A1* | 5/2018 | Camras ............. H01L 33/505 |
| 2018/0123005 A1* | 5/2018 | Ozeki ............... H01L 33/56 |
| 2018/0313501 A1 | 11/2018 | Anc et al. |
| 2019/0093871 A1 | 3/2019 | Sato et al. |
| 2019/0169494 A1 | 6/2019 | Nakamura et al. |
| 2019/0198564 A1 | 6/2019 | Tandon et al. |
| 2020/0142288 A1 | 5/2020 | Okuno et al. |
| 2020/0203567 A1 | 6/2020 | Basin et al. |
| 2020/0388726 A1 | 12/2020 | Meyer et al. |
| 2020/0411736 A1 | 12/2020 | Bechtel et al. |
| 2021/0111320 A1 | 4/2021 | Lopez-Julia et al. |
| 2021/0111316 A1 | 7/2021 | Lopez-Julia et al. |

FOREIGN PATENT DOCUMENTS

| | | |
|---|---|---|
| JP | 2004146835 A | 5/2004 |
| JP | 2006005367 A | 1/2006 |
| JP | 2010245576 A | 10/2010 |
| JP | 2013109907 A | 6/2013 |
| JP | 2013-203822 A | 10/2013 |
| JP | 2013216800 A | 10/2013 |
| JP | 2014507755 A | 3/2014 |
| JP | 2016100485 A | 5/2016 |
| JP | 2016-523450 A | 8/2016 |
| JP | 2019028380 A | 2/2019 |
| JP | 2019537058 A | 12/2019 |
| KR | 2009-0017696 A | 2/2009 |
| KR | 2009-0082499 A | 7/2009 |
| WO | 2008007232 A2 | 1/2008 |
| WO | 2019141480 A1 | 7/2019 |

\* cited by examiner

PROTECTION LAYER FOR A LIGHT EMITTING DIODE

FIELD OF THE INVENTION

The invention relates generally to light emitting diodes and to phosphor-converted light emitting diodes.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED. Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

Multiple LEDs can be formed together on a single substrate to form an array. Such arrays can be employed to form active illuminated displays, such as those employed in smartphones and smart watches, computer or video displays, or signage. An array having one or several or many individual devices per millimeter (e.g., device pitch of about a millimeter, a few hundred microns, or less than 100 microns, and spacing between adjacent devices less than 100 microns or only a few tens of microns or less) typically is referred to as a miniLED array or a microLED array (alternatively, a pLED array). Such mini- or microLED arrays can in many instances also include phosphor converters as described above; such arrays can be referred to as pc-mini- or pc-microLED arrays. In the following description.

SUMMARY

For each of one or more semiconductor light emitting diodes, a corresponding particle layer is positioned over a corresponding light output surface of each light emitting diode. A corresponding transparent protection layer positioned between and in contact with each light output surface and the corresponding particle layer. The particle layer comprises a multitude of optically scattering or luminescent particles and a thin coating layer of transparent material coating particles of the multitude. The particles are characterized by a D50 greater than about 1.0 µm and less than about 30. µm, and the coating layer has a thickness less than about 0.20 µm. The protection layer is less than about 0.05 µm thick and includes one or more materials different from material of the coating layer. Material of the protection layer can include one or more metal or semiconductor oxides, and the coating layer can include one or more metal or semiconductor oxides. Material of the protection layer can be characterized by one or more oxide precursor reactivities, with respect to the corresponding light output surface, that are less than such oxide precursor reactivities characterizing material of the coating layer. The one or more light emitting diodes, along with the corresponding protection and particle layers, can be arranged as an LED array, pcLED array, miniLED array, pc-miniLED array, microLED array, or pc-microLED array.

Objects and advantages pertaining to LEDs, pcLEDs, miniLED arrays, pc-miniLED arrays, microLED arrays, and pc-microLED arrays may become apparent upon referring to the example embodiments illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The embodiments depicted are shown only schematically; all features may not be shown in full detail or in proper proportion; for clarity certain features or structures may be exaggerated or diminished relative to others or omitted entirely; the drawings should not be regarded as being to scale unless explicitly indicated as being to scale. For example, individual LEDs may be exaggerated in their vertical dimensions or layer thicknesses relative to their lateral extent or relative to substrate or phosphor thicknesses. The embodiments shown are only examples and should not be construed as limiting the scope of the present disclosure or appended claims.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

Figure 1:
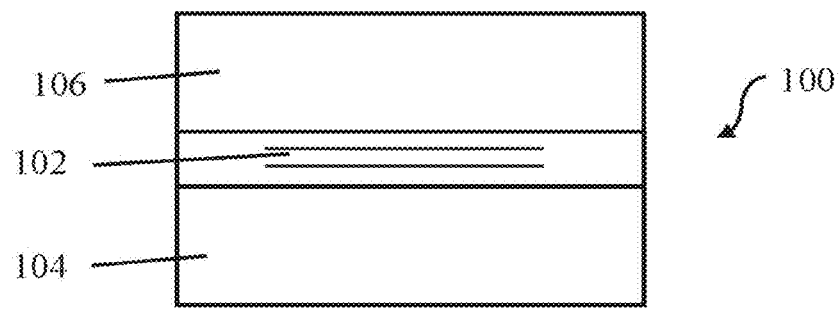
FIG. 1 shows a schematic cross-sectional view of an example pcLED.

FIG. 1 shows an example of an individual pcLED 100 comprising a semiconductor diode structure 102 disposed on a substrate 104, together considered herein an "LED", and a wavelength converting structure (e.g., phosphor layer) 106 disposed on the LED. Semiconductor diode structure 102 typically comprises an active region disposed between n-type and p-type layers. Application of a suitable forward bias across the diode structure results in emission of light from the active region. The wavelength of the emitted light is determined by the composition and structure of the active region.

The LED may be, for example, a III-Nitride LED that emits blue, violet, or ultraviolet light. LEDs formed from any other suitable material system and that emit any other suitable wavelength of light may also be used. Other suitable material systems may include, for example, Ill-Phosphide materials, Ill-Arsenide materials, and II-VI materials.

Any suitable phosphor materials may be used, depending on the desired optical output from the pcLED.

Figure 2A:
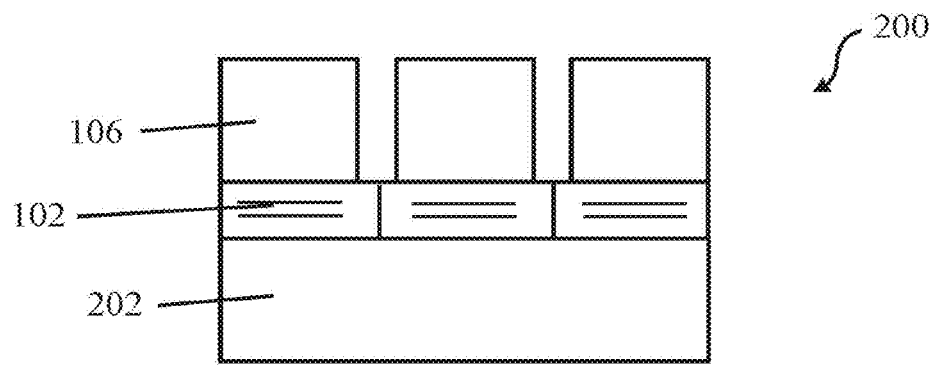
FIGS. 2A and 2B show, respectively, cross-sectional and top schematic views of an example array of pcLEDs.
Figure 2B:
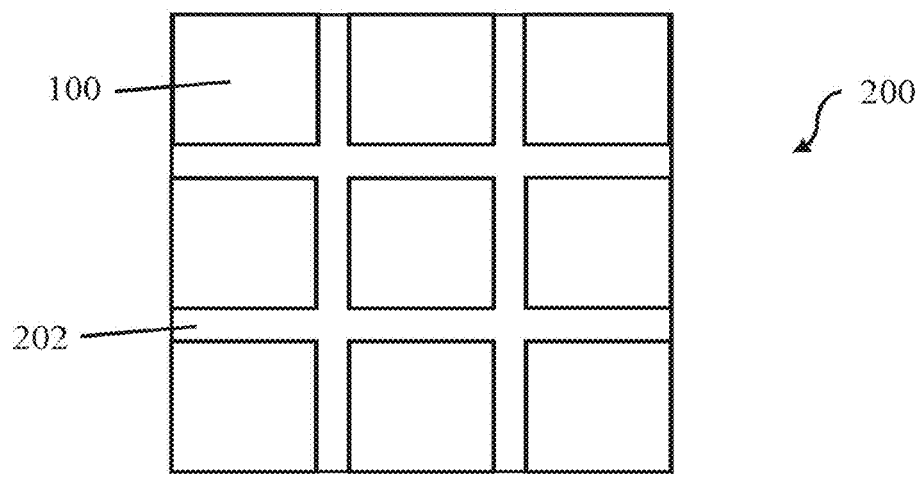

FIGS. 2A-2B show, respectively, cross-sectional and top views of an array 200 of pcLEDs 100, each including a phosphor pixel 106, disposed on a substrate 202. Such an array may include any suitable number of pcLEDs arranged in any suitable manner. In the illustrated example the array is depicted as formed monolithically on a shared substrate, but alternatively an array of pcLEDs may be formed from separate individual pcLEDs. Substrate 202 may optionally comprise CMOS circuitry for driving the LED, and may be formed from any suitable materials.

Figure 3A:
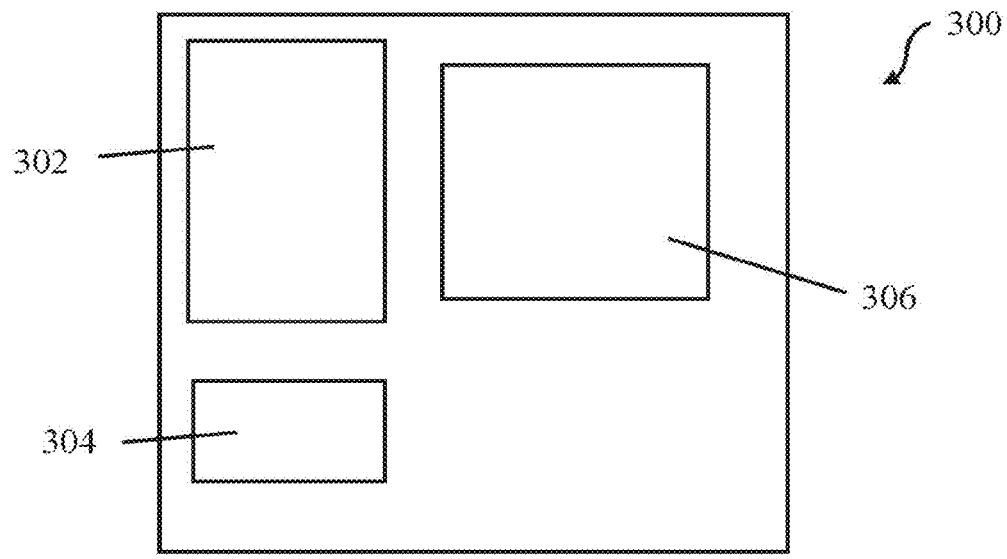
FIG. 3A shows a schematic top view an example electronics board on which an array of pcLEDs may be mounted, and FIG. 3B similarly shows an example array of pcLEDs mounted on the electronic board of FIG. 3A.
Figure 3B:
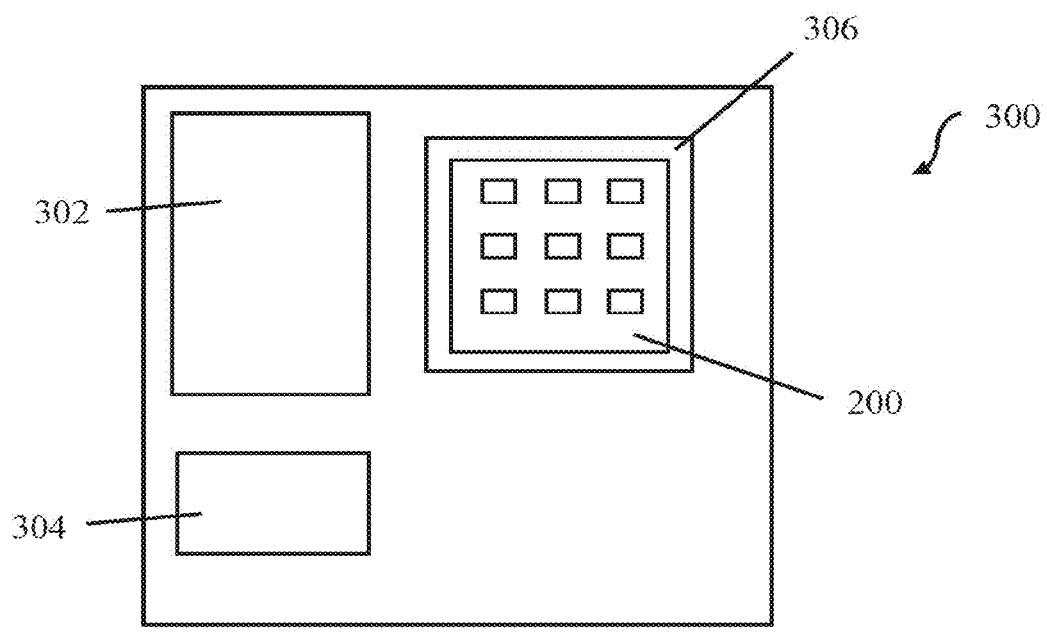

As shown in FIGS. 3A-3B, a pcLED array 200 may be mounted on an electronics board 300 comprising a power and control module 302, a sensor module 304, and an LED attach region 306. Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, pcLED array 200 may be mounted on a separate board (not shown) from the power and control module and the sensor module.

Figure 4A:
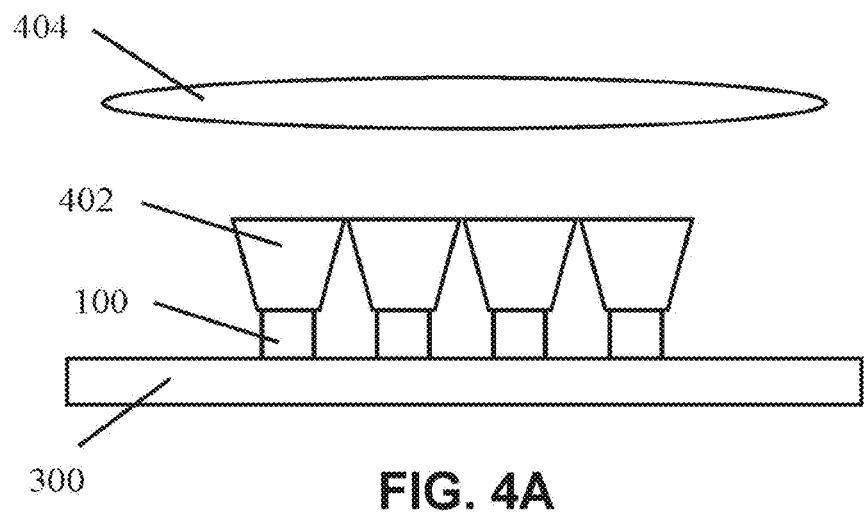
FIG. 4A shows a schematic cross-sectional view of an example array of pcLEDs arranged with respect to waveguides and a projection lens.
Figure 4B:
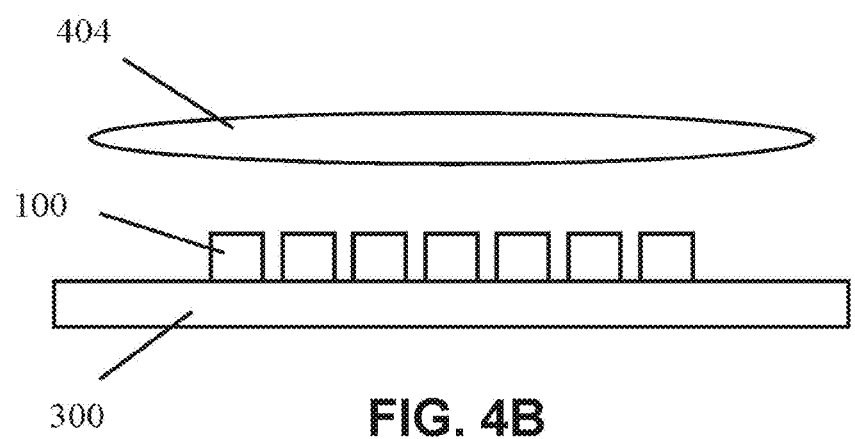
FIG. 4B shows an arrangement similar to that of FIG. 4A, without the waveguides.

Individual pcLEDs may optionally incorporate or be arranged in combination with a lens or other optical element located adjacent to or disposed on the phosphor layer. Such an optical element, not shown in the figures, may be referred to as a "primary optical element". In addition, as shown in FIGS. 4A-4B a pcLED array 200 (for example, mounted on an electronics board 300) may be arranged in combination with secondary optical elements such as waveguides, lenses, or both for use in an intended application. In FIG. 4A, light emitted by pcLEDs 100 is collected by waveguides 402 and directed to projection lens 404. Projection lens 404 may be a Fresnel lens, for example. This arrangement may be suitable for use, for example, in automobile headlights. In FIG. 4B, light emitted by pcLEDs 100 is collected directly by projection lens 404 without use of intervening waveguides. This arrangement may particularly be suitable when pcLEDs can be spaced sufficiently close to each other, and may also be used in automobile headlights as well as in camera flash applications. A miniLED or microLED display application may use similar optical arrangements to those depicted in FIGS. 4A-4B, for example. Generally, any suitable arrangement of optical elements may be used in combination with the pcLEDs described herein, depending on the desired application.

FIG. 1A may include, over 10,000 pixels in any applicable arrangement such as a 100.times.100 matrix, a 200.times.50 matrix, a symmetric matrix, a non-symmetric matrix, or the like. It will also be understood that multiple sets of pixels, matrixes, and/or boards may be arranged in any applicable format to implement the embodiments disclosed herein.

Figure 2C:
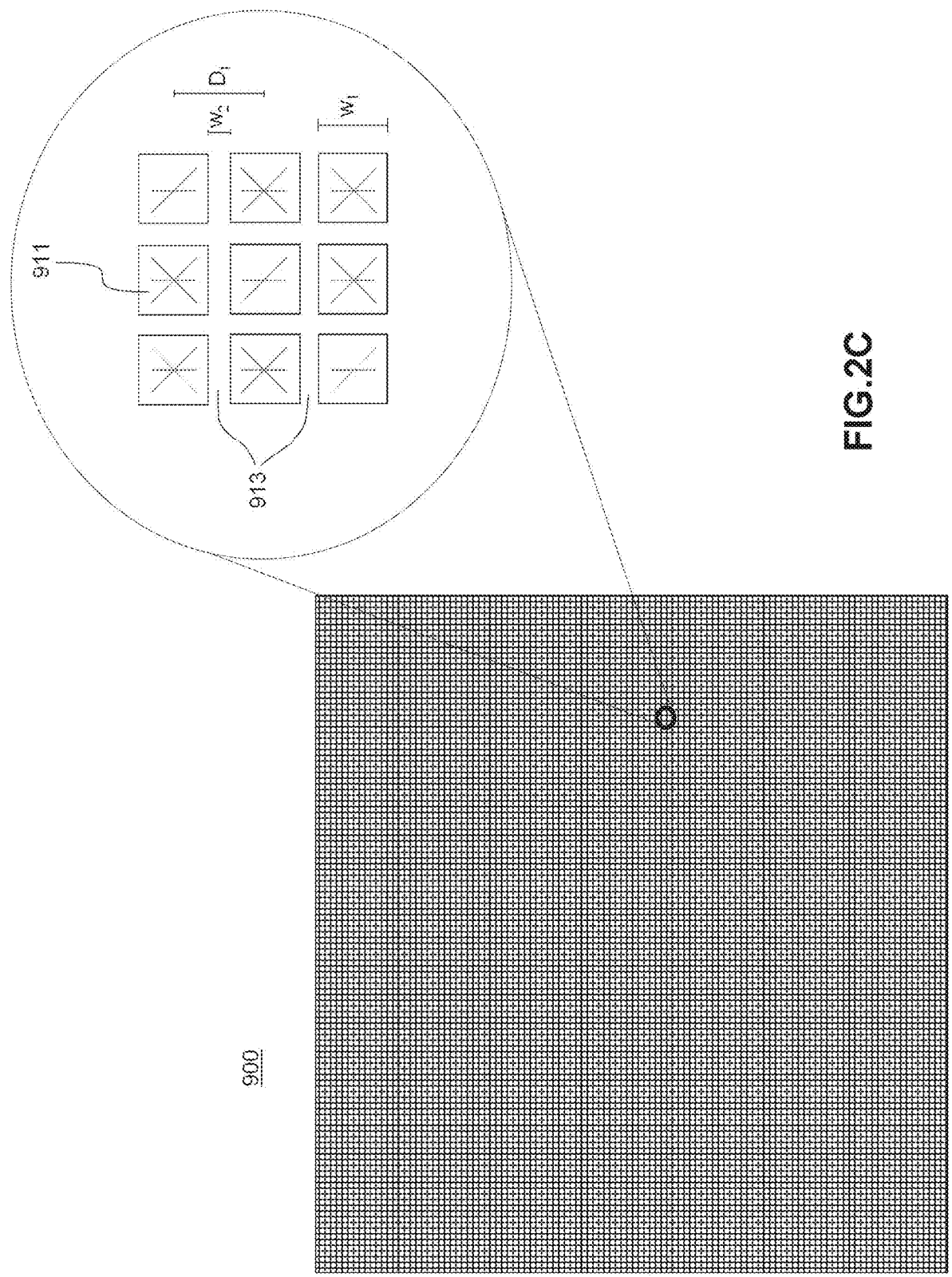
FIG. 2C shows a top schematic view of an example miniLED or microLED array and an enlarged section of 3×3 LEDs of the array.

Although FIGS. 2A and 2B show a 3×3 array of nine pcLEDs, such arrays may include for example on the order of $10^2$, $10^3$, $10^4$, or more LEDs, e.g., as illustrated schematically in FIG. 2C. Individual LEDs 911 (i.e., pixels) may have widths $w_1$ (e.g., side lengths) in the plane of the array 900, for example, less than or equal to 1 millimeter (mm), less than or equal to 500 microns, less than or equal to 100 microns, or less than or equal to 50 microns. LEDs 911 in the array 900 may be spaced apart from each other by streets, lanes, or trenches 913 having a width $w_2$ in the plane of the array 900 of, for example, hundreds of microns, less than or equal to 100 microns, less than or equal to 50 microns, less than or equal to 20 microns, less than or equal to 10 microns, or less than or equal to 5 microns. The pixel pitch $D_1$ is the sum of $w_1$ and $w_2$. Although the illustrated examples show rectangular pixels arranged in a symmetric matrix, the pixels and the array may have any suitable shape or arrangement. Multiple separate arrays of LEDs can be combined in any suitable arrangement in any applicable format.

LEDs having dimensions $w_1$ in the plane of the array (e.g., side lengths) of less than or equal to about 0.10 millimeters microns are typically referred to as microLEDs, and an array of such microLEDs may be referred to as a microLED array. LEDs having dimensions $w_1$ in the plane of the array (e.g., side lengths) of between about 0.10 millimeters and about 1.0 millimeters are typically referred to as miniLEDs, and an array of such miniLEDs may be referred to as a miniLED array.

Figure 2D:
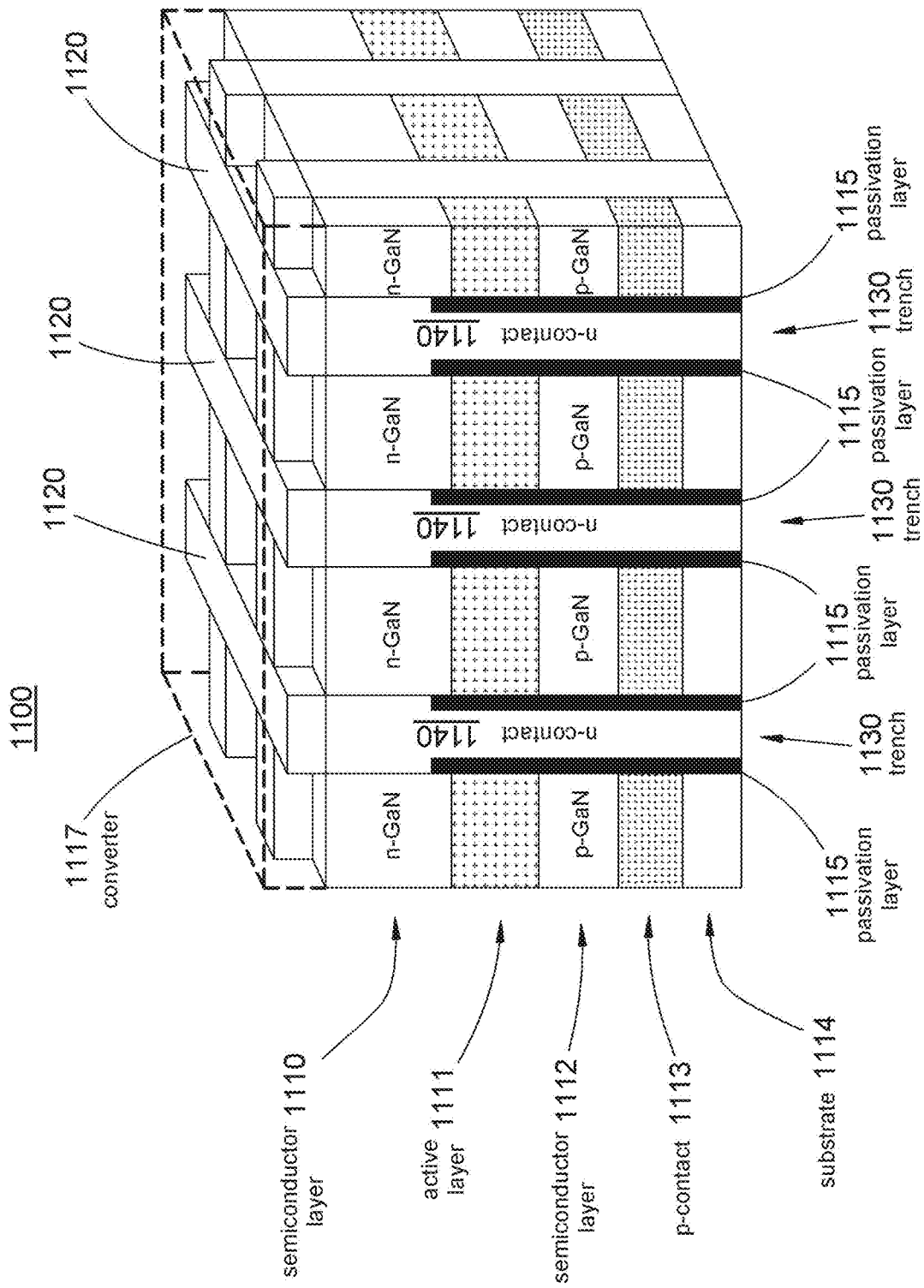
FIG. 2D shows a perspective view of several LEDs of an example pc-miniLED or pc-microLED array monolithically formed on a substrate.

An array of LEDs, miniLEDs, or microLEDs, or portions of such an array, may be formed as a segmented monolithic structure in which individual LED pixels are electrically isolated from each other by trenches and or insulating material. FIG. 2D shows a perspective view of an example of such a segmented monolithic array 1100. Pixels in this array are separated by trenches 1130 which are filled to form n-contacts 1140. The monolithic structure is grown or disposed on a substrate 1114. Each pixel includes a p-contact 1113, a p-GaN semiconductor layer 1112, an active region 1111, and an n-GaN semiconductor layer 1110. A wavelength converter material 1117 may be deposited on the semiconductor layer 1110 (or other applicable intervening layer). Passivation layers 1115 may be formed within the trenches 1130 to separate at least a portion of the n-contacts 1140 from one or more layers of the semiconductor. The n-contacts 1140, or other material within the trenches, may extend into the converter material 1117 such that the n-contacts 1140 or other structures or materials provide complete or partial optical isolation barriers 1120 between the pixels.

The individual LEDs (pixels) in an LED array may be individually addressable, may be addressable as part of a group or subset of the pixels in the array, or may not be addressable. Thus, light emitting pixel arrays are useful for any application requiring or benefiting from fine-grained intensity, spatial, and temporal control of light distribution. These applications may include, but are not limited to, precise special patterning of emitted light from pixel blocks or individual pixels. Depending on the application, emitted light may be spectrally distinct, adaptive over time, and/or environmentally responsive. The light emitting pixel arrays may provide preprogrammed light distribution in various intensity, spatial, or temporal patterns. The emitted light may be based at least in part on received sensor data and may be used for optical wireless communications. Associated electronics and optics may be distinct at a pixel, pixel block, or device level.

Figure 5A:
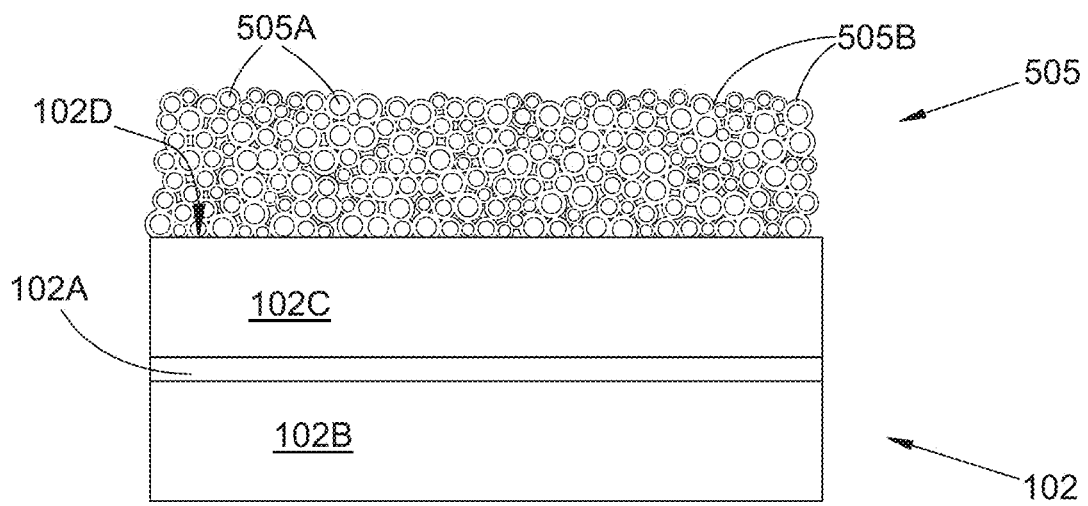
FIGS. 5A through 5C show schematic cross-sectional views of example LEDs comprising a semiconductor LED and a particle layer with no protection layer between the LED and the particle layer.
Figure 5B:
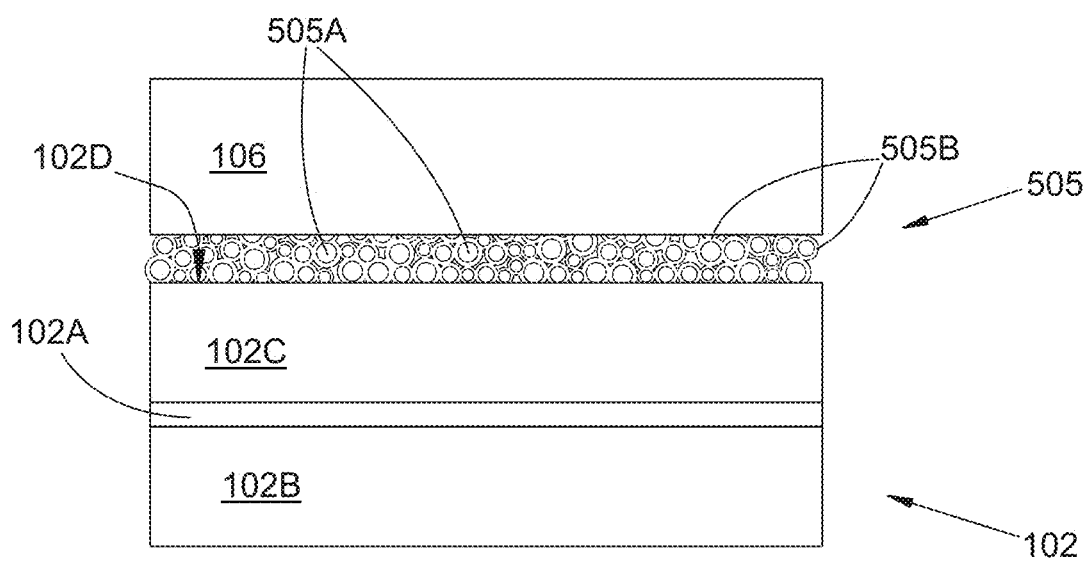
Figure 5C:
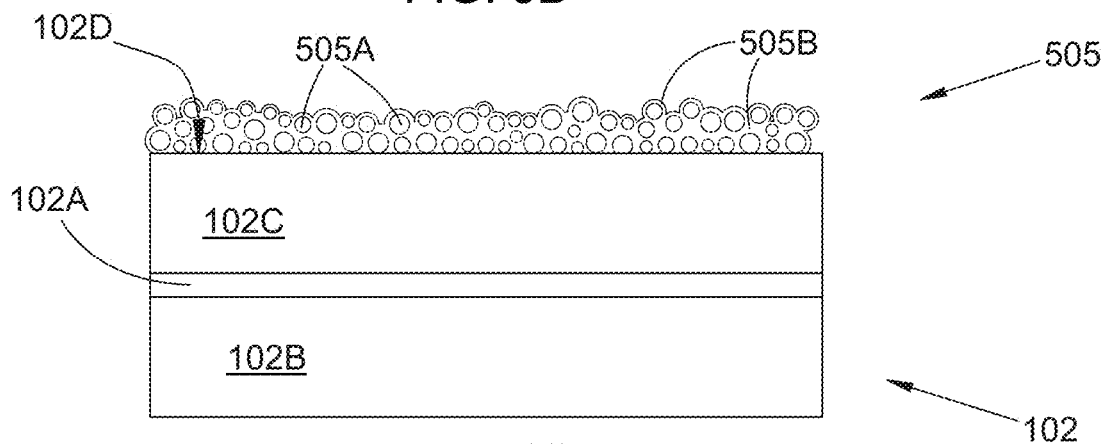

For several different reasons, it may be desirable to form a particle layer 505 on the light output surface 102D of a semiconductor light emitting diode 102 (comprising an active light emitting region 102A between one or more semiconductor layers 102B and one or more semiconductor layers 102C). The particle layer 505 includes a thin transparent coating layer 505B on the particles 505A. The particles 505A can be optically scattering particles or luminescent particles, or both, and can include any suitable one or more materials (e.g., glass, ceramic, crystalline or polycrystalline, and so forth). In some examples, the particle layer 505 forms a wavelength converting phosphor layer on the light output surface of the LED; the coating layer 505B can serve to bond together the particles 505A to one another and to the light output surface 102D (e.g., as shown in FIG. 5A and disclosed in U.S. application Ser. No. 15/802,273 and Ser. No. 16/887,618). By selecting a coating material with a suitably large refractive index, scattering efficiency of the phosphor layer 505 can be increased, which can be beneficial, e.g., for increasing contrast between adjacent light emitting diodes of an array (e.g., as disclosed in U.S. application Ser. No. 16/887,618). In some examples, the particle layer 505 can be arranged to adhere a separate wavelength converting phosphor layer 106 to the light output surface 102D of the light emitting diode 102 (e.g., as shown in FIG. 5B and disclosed in U.S. application Ser. No. 15/802,273). In some examples, the particle layer 505 is index-matched, or nearly index-matched, with the light output surface of the light emitting diode 102D, so that the particle layer 505 acts as an optical coupling structure that enhances extraction of light from the light emitting diode 102 through the light output surface 102D (e.g., as shown in FIG. 5C and disclosed in U.S. application Ser. No. 16/597, 455). Each of the three patent applications mentioned in this paragraph is incorporated by reference in its entirety.

The particles 505A typically are sub-micron to micron scale, e.g., being characterized by a D50 (i.e., median transverse dimension) greater than about 0.10 µm and less than about 20. µm. The particles 505A can be applied to the light output surface 102D in any suitable way, such as by spray-coating, sedimentation, and so forth. The coating layer 505B is then deposited onto the particles 505A and portions of the light output surface 102D. A conformal deposition process is used to deposit the coating layer 505B, so that it coats all sides of the particles 505A while remaining sufficiently thin (e.g., less than about 0.30 µm); if allowed to progress, the deposited coating layer material 505B can fill voids between the particles 505A. Typically, atomic layer deposition (ALD) or other suitable chemical vapor deposition (CVD) process is employed for depositing the coating layer material 505B. A typical ALD reaction is split into (at least) two parts. In a first step the oxide precursor (metal or semiconductor) is fed into the reactor and adsorbs and/or reacts with reactive groups on the surfaces; substantially all non-reacted or adsorbed precursor molecules are removed by reactor purging. In a second step the oxygen source (e.g., water or ozone) is fed into the reactor and reacts with the metal or semiconductor source on the particle surfaces; reactor urging removes substantially all remaining oxygen source molecules and hydrolysis products formed by condensation reactions. The two steps lead to formation of an atomic layer (or monolayer) because of the self-limiting nature of the surface reaction. These atomic layer reaction steps are repeated multiple times to form the final ALD coating. The step by step nature of the ALD process allows conformal coatings also on and in structures with large aspect-ratio such as phosphor particles. The ALD process further allows deposition of layers of different composition by consecutively feeding different oxide precursor into the reactor to form multicomponent layers or nanolaminates with tailored optical properties.

in some examples the coating layer material 505B includes one or more metal or semiconductor oxides. Examples of suitable materials can include, e.g., $Al_2O_3$, $HfO_2$, $SiO_2$, $Ga_2O_3$, $GeO_2$, $SnO_2$, $CrO_2$, $TiO_2$, $Ta_2O_5$, $Nb_2O_5$, $V_2O_5$, $Y_2O_3$, or $ZrO_2$. In ALD and other CVD processes various oxide precursors are employed (in gaseous form) that react to deposit the desired material on a surface. Examples of oxide precursors include, e.g., one or more metal or semiconductor halides, amides, alkyl amides, or alkoxides, or other metal, semiconductor, or organometallic compounds (organometallic compounds including at least one bond between carbon and a metal or metalloid). Examples of specific precursors can include, but are not limited to: $Al(CH_3)_3$, $HAl(CH_3)_2$, $Hf(N(CH_3)_2)_4$, $Hf(N(CH_2CH_3)_2)_4$, $TaCl_5$, $Ta(N(CH_3)_2)_5$, $ZrCl_4$, $Zr(N(CH_3)_2)_4$, $TiCl_4$, $Ti(OCH_3)_4$, $Ti(OEt)_4$, $SiCl_4$, $H_2N(CH_2)_3$, $Si(OEt)_3$, $Si(OEt)_4$, tert-(butylimido)-tris (diethylamino)-niobium, or tris(ethylcyclopentadienyl) yttrium.

It has been observed, however, that in some instances exposure of the light output surface 102D (typically the surface of a III-V semiconductor) to certain oxide precursors can degrade that surface, resulting in reduced device lifetime or reliability. Such degradation is noticeable, e.g., after deposition of $Al_2O_3$ on the light output surface of a GaN-based light emitting diode using trimethylaluminum (TMA; $Al(CH_3)_3$). It would be desirable to reduce or prevent such degradation of the light output surface 102D during deposition of the coating layer material 505B.

Figure 6A:
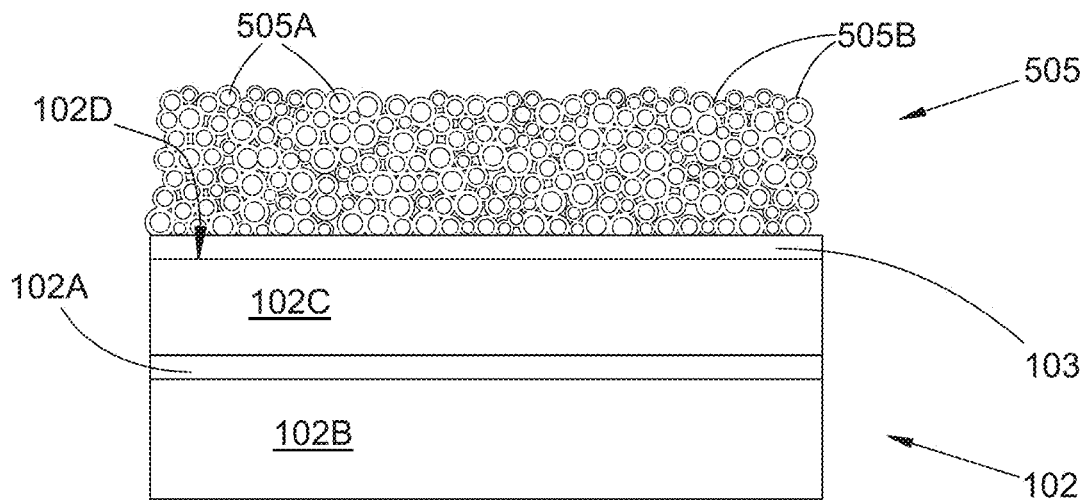
FIGS. 6A through 6C show schematic cross-sectional views of example LEDs comprising a semiconductor LED and a particle layer with a protection layer between the LED and the particle layer.
Figure 6B:
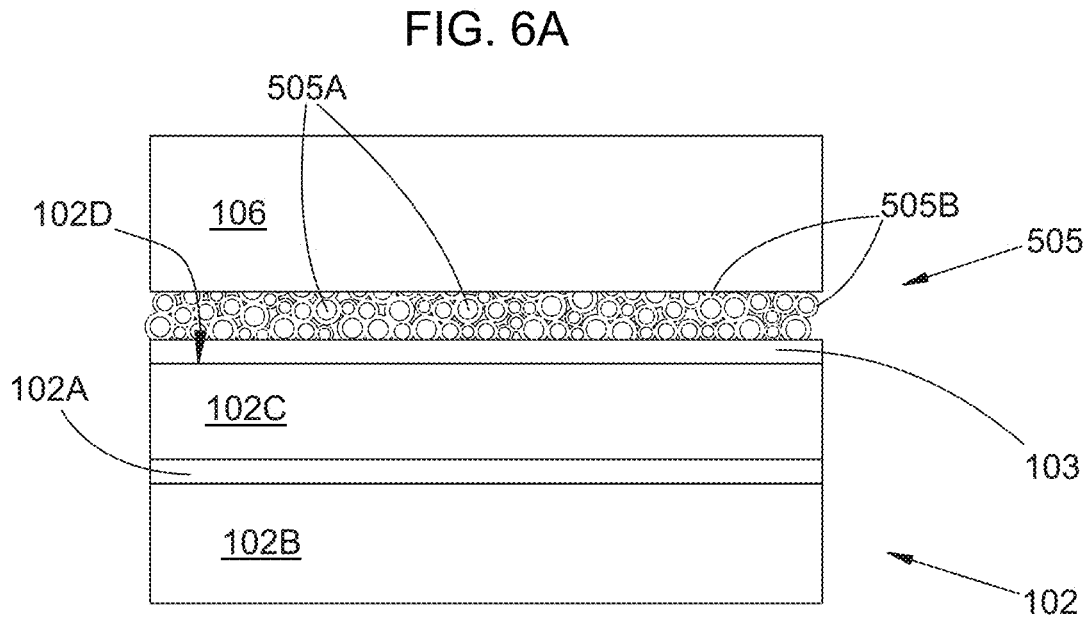
Figure 6C:
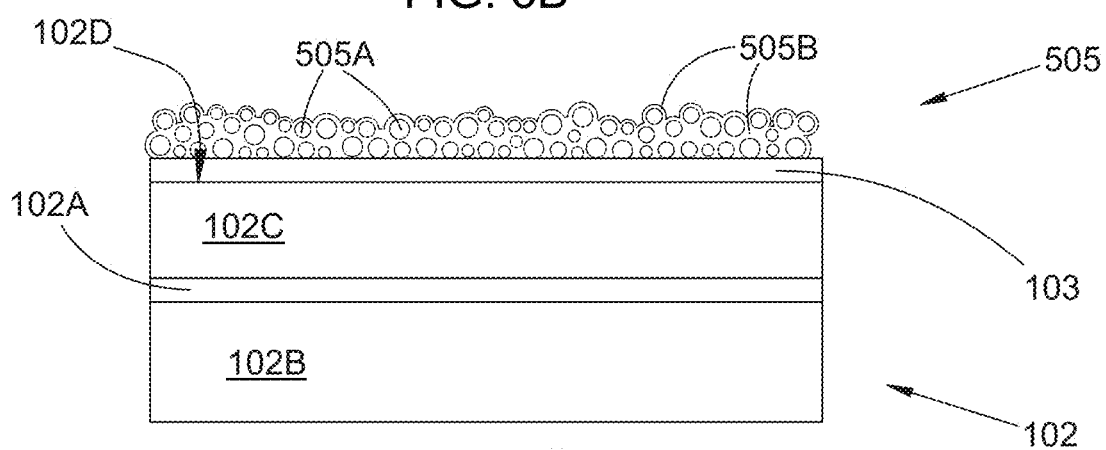

Accordingly, a light emitting apparatus 100 comprising a semiconductor light emitting diode 102 (including active region 102A and semiconductor layers 102B and 102C) and a particle layer 505 can further include on its light emitting surface 102D, between and in contact with the light output surface 102D and the particle layer 505, a protection layer 103 (e.g., as in FIGS. 6A, 6B, and 6C). The particle layer 505 is positioned over the light output surface 102D and comprises a multitude of the particles 505A and the thin coating layer 505B. The particles 505A can be optically scattering, luminescent, or both, and are characterized by a D50 (i.e., median size) greater than about 0.10 µm and less than about 20. μm. The coating layer 505B of transparent material coats particles 505A and is less than about 0.30 μm thick, or less than about 0.20 μm thick, or less than about 0.10 μm thick. The transparent protection layer 103 is positioned between and in contact with the light output surface 102D and the particle layer 505. The protection layer 103 is less than about 0.05 μm thick, less than about 0.03 μm thick, or less than about 0.020 μm thick, and includes one or more materials different from material of the coating layer. In examples wherein the protection layer 103 includes multiple materials, those materials can be arranged as multiple discrete sublayers of the protection layer 103; in such examples each of those layers can be less than about 0.020 μm thick, or less than about 0.010 μm thick.

Multiple LEDs 102, with multiple corresponding protection layers 103 and particle layers 505, can be arranged as an LED array, a miniLED array, or a microLED array. If arranged as a miniLED array, each light emitting diode 102 has transverse dimensions less than about 1.0 millimeters and is separated from adjacent light emitting diodes 102 of the array by less than about 0.10 millimeters. If arranged as a microLED array, each light emitting diode 102 (i) has transverse dimensions less than about 0.10 millimeters or less than about 0.05 millimeters, and (ii) is separated from adjacent light emitting diodes of the array by less than about 0.05 millimeters, less than about 0.20 millimeters, or less than about 0.10 millimeters. In some examples, each of the light emitting diodes 102 of the array has a combined thickness of layers 102A/102B/102C that is less than about 5.0 μm thick.

In many examples, material of the protection layer 103 includes one or more metal or semiconductor oxides; in many examples, the coating layer 505B includes one or more metal or semiconductor oxides. Material of the protection layer 103 is characterized by one or more oxide precursor reactivities, with respect to the corresponding light output surface 102D, that are less than such oxide precursor reactivities characterizing material of the coating layer 505B. By choosing such materials, degradation of the light output surface can be reduced or eliminated. The less reactive oxide precursors of the protection layer 103 can react and form that layer with less degradation, or no degradation, of the light output surface 102D. With the light output surface thus protected, the coating layer 505B can be formed using its corresponding oxide precursors without degrading (or further degrading) the light output surface 102D; that degradation (or further degradation) is prevented by the presence of the protection layer 103, which shields the light output surface 102D from contact with oxide precursors of the coating layer 505B.

In some examples, material of the protection layer 103 can include one or more materials selected from a group consisting of $HfO_2$, $SiO_2$, $Ga_2O_3$, $GeO_2$, $SnO_2$, $CrO_2$, $Nb_2O_5$, $TiO_2$, $Ta_2O_5$, $V_2O_5$, $Y_2O_3$, and $ZrO_2$. Layers of those materials, and particularly multiple layers of different materials chosen from those materials, are known form dense pinhole-free layers that are nearly impermeable to gasses such as water or trimethyl aluminum (TMA, an aluminum oxide precursor). Such impermeable layers may be desirable for forming the protection layer 103. In some examples, material of the coating layer 505B can include one or more materials selected from a group consisting of $Al_2O_3$, $HfO_2$, $SiO_2$, $Ga_2O_3$, $GeO_2$, $SnO_2$, $CrO_2$, $Nb_2O_5$, $TiO_2$, $Ta_2O_5$, $V_2O_5$, $Y_2O_3$, and $ZrO_2$. Choice of one or more specific materials for the protection layer 103 can be constrained by the material used for the high-index material 505B. For example, if $TiO_2$ is employed as the high-index material 505B, then a different material would be employed for the protection layer 505B, with corresponding oxide precursors less reactive than those of $TiO_2$. In some examples, the light output surface 102D is a GaN, AlN, AlGaN alloy, GaP, AlGaP, AlInGaP alloy, or other III-V semiconductor material surface. In some examples, the protection layer 103 includes $HfO_2$ and the coating layer 505B includes $Al_2O_3$.

In some examples (e.g., as in FIG. 6A), the particles 505A include luminescent particles and the particle layer 505 forms a corresponding phosphor wavelength conversion layer of the corresponding light emitting diode. The coating layer material 505B adheres the particles 505A to each other and to the light output surface 102D. That arrangement is analogous to the arrangement of FIG. 5A, with the addition of the protection layer 103 between the light output surface 102D and the wavelength conversion phosphor layer 505.

In some examples (e.g., as in FIG. 6B), a separate phosphor wavelength conversion layer 106 is positioned on and in contact with the particle layer 505; the particles 505A can, but need not be, luminescent particles. The coating material 505B adheres the particles 505A to each other, to the light output surface 102D, and to the phosphor layer 106; the particle layer 505 serves to adhere the wavelength conversion layer 106 to the protection layer 103 and so to the LED 102. That arrangement is analogous to the arrangement of FIG. 5B, with the addition of the protection layer 103 between the light output surface 102D and the adhesion/particle layer 505.

In some examples (e.g., as in FIG. 6C), the coating layer material 505B can have an index of refraction matching or approximately matching an index of refraction of the light output surface 102D. In such examples the particle layer 505 acts as an optical coupling structure, enhancing extraction of light from the LED 102 through the light output surface 102D. That arrangement is analogous to the arrangement of FIG. 5C, with the addition of the protection layer 103 between the light output surface 102D and the optical coupling structure 505. Note that in some examples the particle layer 505 can serve simultaneously as both an optical coupling structure (e.g., as in FIG. 6C) and an adhesion layer (e.g., as in FIG. 6B).

Figure 7A:
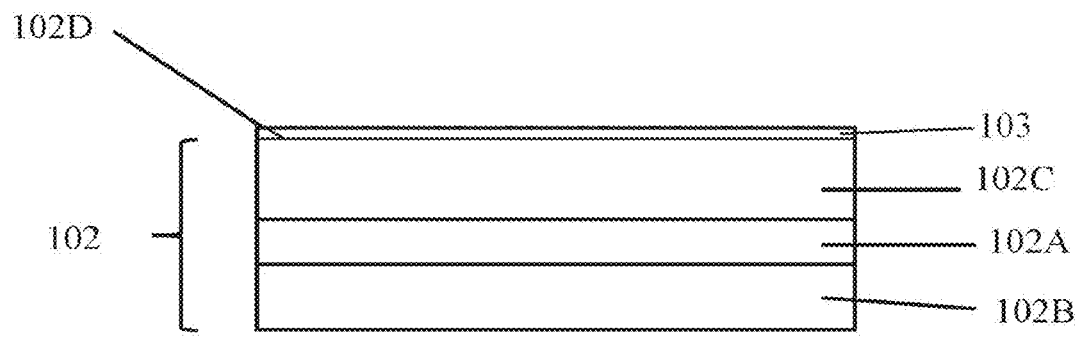
FIGS. 7A through 7C illustrate schematically steps in an example method for manufacturing an example pcLED that includes a protective layer between the semiconductor LED and a particle layer.
Figure 7B:
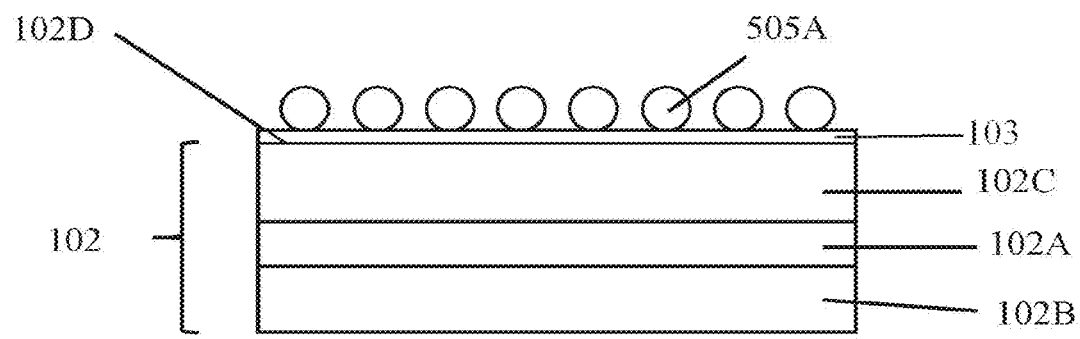
Figure 7C:
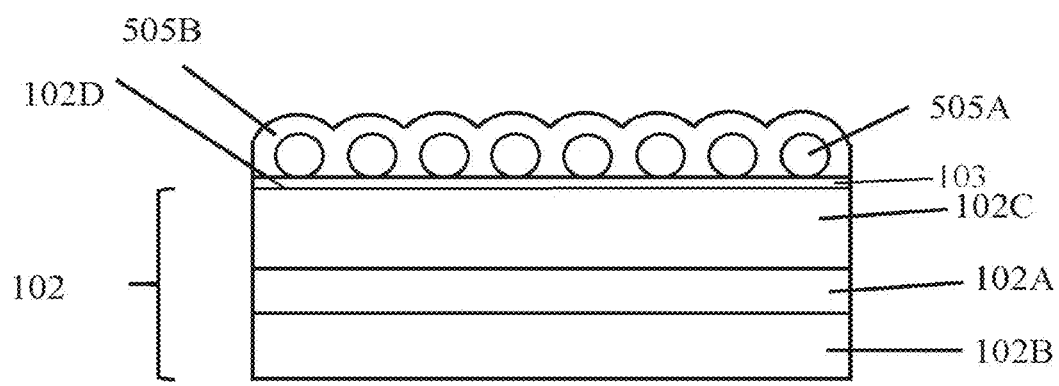
Figure 8:
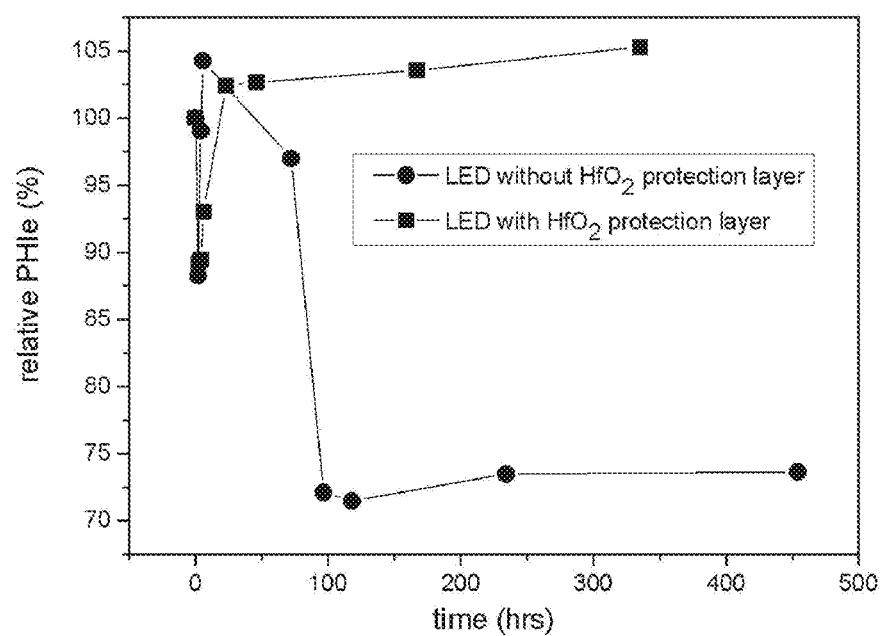
FIG. 8 is a plot showing contrasting reliability results for LEDs with and without a protection layer between the LED and a particle layer.

Any of the LEDs 102 or arrays described above can be fabricated by first forming the protection layer 103 on the light output surface 102D, and then forming the particle layer 505 on the protection layer 103. The particle layer 505 typically is formed by first applying the particles 505A to the protection layer 103, and then depositing the coating material layer 505B (e.g., as illustrated schematically in FIGS. 7A through 7C). In the cross-sectional view of FIG. 7A, a protection layer 103 has been formed, using ALD or other suitable CVD process, on the light output surface 102D of the semiconductor LED 102. In FIG. 7B a single layer of particles 505A is deposited on the protection layer 103 using any suitable process, for example by sedimentation; in other examples multiple layers of particles 505A can be deposited. In FIG. 7C, the high-index material 505B may be deposited, e.g., by ALD, to form a conformal coating on particles as shown in FIG. 7C (and described above). FIG. 8 shows contrasting reliability results for LEDs with and without an $HfO_2$ protection layer 103. Operated at 1 ampere at 85° C., the protected LED recovers nearly completely after about 50 hours of operation, whereas the unprotected LED exhibits significant, non-reversible degradation.

In some examples, the protection layer 103 includes one or more metal or semiconductor oxides and can be formed using atomic layer deposition or chemical vapor deposition using one or more corresponding protection layer oxide precursors. In some examples, the coating layer 505B includes one or more metal or semiconductor oxides and is formed using atomic layer deposition or chemical vapor deposition using one or more corresponding coating layer oxide precursors different from the one or more protection layer oxide precursors. The protection layer oxide precursors exhibit reactivities, with respect to the corresponding light output surface 102D, that are less than such oxide precursor reactivities exhibited by the one or more coating layer oxide precursors. In other words, forming the protection layer 103 is less damaging to the light output surface 102D than forming the coating layer 505B would have been; in some instances forming the protection layer 103 may not be damaging at all. The presence of the protection layer 103 during deposition of the coating layer 505B reduces or prevents damage to the light output surface 102D by the coating layer oxide precursors.

In some examples, (i) the protection layer includes $HfO_2$, (ii) the protection layer oxide precursors include one or more of tetrakis(dimethylamino)hafnium ($Hf(NMe_2)_4$), tetrakis (ethylmethylamino)hafnium ($Hf(NMeEt)_4$), or tetrakis(diethylamino)hafnium ($Hf(NEt_2)_4$), (iii) the coating layer includes $Al_2O_3$, and (iv) the coating layer oxide precursors include one or more of trimethylaluminum ($Al(CH_3)_3$) or dimethylaluminum hydride ($HAl(CH_3)_2$).

The choice of material for the protection layer 103, and the high-index material 505B, in some instances can be constrained by limits on the reaction conditions permitted for the deposition process. In some examples, an array of LEDs 102 can be mounted on a drive or control circuit substrate (e.g., a CMOS TFT substrate) before forming the protection layer 103 and the particle layer 505. Because some or all of the electronic components on the circuit substrate cannot tolerate excessive heating, in some examples the protection layer 103 and the coating layer are formed at temperatures less than about 150° C.

This disclosure is illustrative and not limiting. Further modifications will be apparent to one skilled in the art in light of this disclosure and are intended to fall within the scope of the appended claims.

In addition to the preceding, the following example embodiments fall within the scope of the present disclosure or appended claims:

Example 1. An apparatus comprising: (a) one or more semiconductor light emitting diodes, each having a corresponding light output surface; (b) a corresponding particle layer positioned over each light output surface and comprising a multitude of optically scattering or luminescent particles characterized by a D50 greater than about 0.10 µm and less than about 20. µm, and a thin coating layer of transparent material coating particles of the multitude, the coating layer having a thickness less than about 0.30 µm; and (c) a corresponding transparent protection layer positioned between and in contact with each light output surface and the corresponding particle layer, the protection layer being less than about 0.05 µm thick and including one or more materials different from material of the coating layer.

Example 2. The apparatus of Example 1, wherein: (i) material of each protection layer includes one or more metal or semiconductor oxides, (ii) the coating layer includes one or more metal or semiconductor oxides, and (iii) material of each protection layer is characterized by one or more oxide precursor reactivities, with respect to the corresponding light output surface, that are less than such oxide precursor reactivities characterizing material of the coating layer.

Example 3. The apparatus of any one of Examples 1 or 2, wherein (i) material of the protection layer includes one or more materials selected from a group consisting of $HfO_2$, $SiO_2$, $Ga_2O_3$, $GeO_2$, $SnO_2$, $CrO_2$, $Nb_2O_5$, $TiO_2$, $Ta_2O_5$, $V_2O_5$, $Y_2O_3$, and $ZrO_2$, (ii) material of the coating layer includes one or more materials selected from a group consisting of $Al_2O_3$, $HfO_2$, $SiO_2$, $Ga_2O_3$, $GeO_2$, $SnO_2$, $CrO_2$, $Nb_2O_5$, $TiO_2$, $Ta_2O_5$, $V_2O_5$, $Y_2O_3$, and $ZrO_2$, and (iii) each light output surface is a GaN, AlN, AlGaN alloy, GaP, AlGaP, or AlInGaP alloy material surface.

Example 4. The apparatus of any one of Examples 1 through 3, wherein the protection layer includes $HfO_2$ and the coating layer includes $Al_2O_3$.

Example 5. The apparatus of any one of Examples 1 through 4, wherein the one or more semiconductor light emitting diodes form an array of semiconductor light emitting diodes having corresponding light output surfaces, each light emitting diode (i) having transverse dimensions less than about 1.0 millimeters and (ii) being separated from adjacent light emitting diodes of the array by less than about 0.10 millimeters.

Example 6. The apparatus of any one of Examples 1 through 5, wherein the one or more semiconductor light emitting diodes form an array of semiconductor light emitting diodes having corresponding light output surfaces, each light emitting diode (i) having transverse dimensions less than about 0.10 millimeters and (ii) being separated from adjacent light emitting diodes of the array by less than about 0.05 millimeters.

Example 7. The apparatus of any one of Examples 1 through 6, wherein each light emitting diode has a combined thickness of n-doped, active, and p-doped layers less than about 5 µm thick.

Example 8. The apparatus of any one of Examples 1 through 7, wherein the particles of the multitude include luminescent particles and each particle layer forms a corresponding phosphor wavelength conversion layer of the corresponding light emitting diode.

Example 9. The apparatus of any one of Examples 1 through 8, further comprising a corresponding phosphor wavelength conversion layer positioned on and in contact with the corresponding particle layer, each particle layer adhering the corresponding wavelength conversion layer to the corresponding protection layer.

Example 10. The apparatus of any one of Examples 1 through 9, wherein the coating layer material has an index of refraction matching or approximately matching an index of refraction of each light output surface.

Example 11. A method for forming the apparatus of any one of Examples 1 through 10, the method comprising: (A) forming, on the corresponding light output surface of each of the one or more semiconductor light emitting diodes, the corresponding transparent protection layer in contact with each light output surface, the protection layer being less than about 0.05 µm thick; and (B) forming, on the corresponding protection layer on each light output surface, the corresponding particle layer positioned on and in contact with the corresponding protection layer, each particle layer comprising a multitude of optically scattering or luminescent particles characterized by a D50 greater than about 0.10 µm and less than about 20. µm, and a thin coating layer of transparent material coating particles of the multitude, the coating layer having a thickness less than about 0.30 µm, the protection layer including one or more materials different from material of the coating layer.

Example 12. The method of Example 11, wherein: (A') the protection layer includes one or more metal or semiconductor oxides and is formed using atomic layer deposition or chemical vapor deposition using one or more corresponding protection layer oxide precursors; (B') the coating layer includes one or more metal or semiconductor oxides and is formed using atomic layer deposition or chemical vapor deposition using one or more corresponding coating layer oxide precursors different from the one or more protection layer oxide precursors; and (C) the one or more protection layer oxide precursors exhibit reactivities, with respect to the corresponding light output surface, that are less than such oxide precursor reactivities exhibited by the one or more coating layer oxide precursors.

Example 13. The method of Example 12, wherein the oxide precursors include one or more metal or semiconductor halides, amides, alkyl amides, or alkoxides, or organometallic compounds.

Example 14. The method of any one of Examples 12 or 13, wherein the one or more protection layer oxide precursors or the one or more coating layer precursors can include on or more of $Al(CH_3)_3$, $HAl(CH_3)_2$, $Hf(N(CH_3)_2)_4$, $Hf(N(CH_2CH_3)_2)_4$, $TaCl_5$, $Ta(N(CH_3)_2)_5$, $ZrCl_4$, $Zr(N(CH_3)_2)_4$, $TiCl_4$, $Ti(OCH_3)_4$, $Ti(OEt)_4$, $SiCl_4$, $H_2N(CH_2)_3$, $Si(OEt)_3$, $Si(OEt)_4$, tert-(butylimido)-tris (diethylamino)-niobium, or tris(ethylcyclopentadienyl) yttrium.

Example 15. The method of any one of Examples 12 through 14, wherein (i) the protection layer includes $HfO_2$, (ii) the protection layer oxide precursors include one or more of tetrakis(dimethylamino)hafnium ($Hf(NMe_2)_4$), tetrakis(ethylmethylamino)hafnium ($Hf(NMeEt)_4$), or tetrakis(diethylamino)hafnium ($Hf(NEt_2)_4$), (iii) the coating layer includes $Al_2O_3$, and (iv) the coating layer oxide precursors include one or more of trimethylaluminum ($Al(CH_3)_3$) or dimethylaluminum hydride ($HAl(CH_3)_2$).

Example 16. The method of any one of Examples 11 through 15, further comprising adhering to the corresponding protection layer on each light output surface, using the corresponding particle layer, a corresponding phosphor wavelength conversion layer positioned on and in contact with the corresponding particle layer.

Example 17. The method of any one of Examples 11 through 16, wherein each corresponding protection layer and the coating layer are formed at temperatures less than about 150° C.

It is intended that equivalents of the disclosed example embodiments and methods shall fall within the scope of the present disclosure or appended claims. It is intended that the disclosed example embodiments and methods, and equivalents thereof, may be modified while remaining within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Therefore, the present disclosure shall be construed as implicitly disclosing any embodiment having any suitable subset of one or more features—which features are shown, described, or claimed in the present application—including those subsets that may not be explicitly disclosed herein. A "suitable" subset of features includes only features that are neither incompatible nor mutually exclusive with respect to any other feature of that subset. Accordingly, the appended claims are hereby incorporated in their entirety into the Detailed Description, with each claim standing on its own as a separate disclosed embodiment. In addition, each of the appended dependent claims shall be interpreted, only for purposes of disclosure by said incorporation of the claims into the Detailed Description, as if written in multiple dependent form and dependent upon all preceding claims with which it is not inconsistent. It should be further noted that the cumulative scope of the appended claims can, but does not necessarily, encompass the whole of the subject matter disclosed in the present application.

The following interpretations shall apply for purposes of the present disclosure and appended claims. The words "comprising," "including," "having," and variants thereof, wherever they appear, shall be construed as open ended terminology, with the same meaning as if a phrase such as "at least" were appended after each instance thereof, unless explicitly stated otherwise. The article "a" shall be interpreted as "one or more" unless "only one," "a single," or other similar limitation is stated explicitly or is implicit in the particular context; similarly, the article "the" shall be interpreted as "one or more of the" unless "only one of the," "a single one of the," or other similar limitation is stated explicitly or is implicit in the particular context. The conjunction "or" is to be construed inclusively unless: (i) it is explicitly stated otherwise, e.g., by use of "either . . . or," "only one of," or similar language; or (ii) two or more of the listed alternatives are understood or disclosed (implicitly or explicitly) to be incompatible or mutually exclusive within the particular context. In that latter case, "or" would be understood to encompass only those combinations involving non-mutually-exclusive alternatives. In one example, each of "a dog or a cat," "one or more of a dog or a cat," and "one or more dogs or cats" would be interpreted as one or more dogs without any cats, or one or more cats without any dogs, or one or more of each. In another example, each of "a dog, a cat, or a mouse," "one or more of a dog, a cat, or a mouse," and "one or more dogs, cats, or mice" would be interpreted as (i) one or more dogs without any cats or mice, (ii) one or more cats without and dogs or mice, (iii) one or more mice without any dogs or cats, (iv) one or more dogs and one or more cats without any mice, (v) one or more dogs and one or more mice without any cats, (vi) one or more cats and one or more mice without any dogs, or (vii) one or more dogs, one or more cats, and one or more mice. In another example, each of "two or more of a dog, a cat, or a mouse" or "two or more dogs, cats, or mice" would be interpreted as (i) one or more dogs and one or more cats without any mice, (ii) one or more dogs and one or more mice without any cats, (iii) one or more cats and one or more mice without and dogs, or (iv) one or more dogs, one or more cats, and one or more mice; "three or more," "four or more," and so on would be analogously interpreted.

For purposes of the present disclosure or appended claims, when terms are employed such as "about equal to," "substantially equal to," "greater than about," "less than about," and so forth, in relation to a numerical quantity, standard conventions pertaining to measurement precision and significant digits shall apply, unless a differing interpretation is explicitly set forth. For null quantities described by phrases such as "substantially prevented," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an embodiment, example, or claim (e.g., first, second, third, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. An apparatus comprising:
   (a) one or more semiconductor light emitting diodes, each having a corresponding light output surface;
   (b) a corresponding particle layer positioned over each light output surface and comprising a multitude of optically scattering or luminescent particles characterized by a D50 greater than about 0.10 µm and less than about 20. µm, and a thin coating layer of transparent material coating particles of the multitude, the coating layer having a thickness less than about 0.30 µm; and
   (c) a corresponding transparent protection layer positioned between and in contact with each light output surface and the corresponding particle layer, the protection layer being less than about 0.05 µm thick and including one or more materials different from material of the coating layer.

2. The apparatus of claim 1, wherein: (i) material of each protection layer includes one or more metal or semiconductor oxides, (ii) the coating layer includes one or more metal or semiconductor oxides, and (iii) material of each protection layer is characterized by one or more oxide precursor reactivities, with respect to the corresponding light output surface, that are less than such oxide precursor reactivities characterizing material of the coating layer.

3. The apparatus of claim 2, wherein (i) material of the protection layer includes one or more materials selected from a group consisting of $HfO_2$, $SiO_2$, $Ga_2O_3$, $GeO_2$, $SnO_2$, $CrO_2$, $Nb_2O_5$, $TiO_2$, $Ta_2O_5$, $V_2O_5$, $Y_2O_3$, and $ZrO_2$, (ii) material of the coating layer includes one or more materials selected from a group consisting of $Al_2O_3$, $HfO_2$, $SiO_2$, $Ga_2O_3$, $GeO_2$, $SnO_2$, $CrO_2$, $Nb_2O_5$, $TiO_2$, $Ta_2O_5$, $V_2O_5$, $Y_2O_3$, and $ZrO_2$, and (iii) each light output surface is a GaN, AlN, AlGaN alloy, GaP, AlGaP, or AlInGaP alloy material surface.

4. The apparatus of claim 3, wherein the protection layer includes $HfO_2$ and the coating layer includes $Al_2O_3$.

5. The apparatus of claim 1, wherein the one or more semiconductor light emitting diodes form an array of semiconductor light emitting diodes having corresponding light output surfaces, each light emitting diode (i) having transverse dimensions less than about 1.0 millimeters and (ii) being separated from adjacent light emitting diodes of the array by less than about 0.10 millimeters.

6. The apparatus of claim 1, wherein each light emitting diode has a combined thickness of n-doped, active, and p-doped layers less than about 5 µm thick.

7. The apparatus of claim 1, wherein the particles of the multitude include luminescent particles and each particle layer forms a corresponding phosphor wavelength conversion layer of the corresponding light emitting diode.

8. The apparatus of claim 1, further comprising a corresponding phosphor wavelength conversion layer positioned on and in contact with the corresponding particle layer, each particle layer adhering the corresponding wavelength conversion layer to the corresponding protection layer.

9. The apparatus of claim 1, wherein the coating layer material has an index of refraction matching or approximately matching an index of refraction of each light output surface.

10. A method comprising:
    (A) forming, on a corresponding light output surface of each of one or more semiconductor light emitting diodes, a corresponding transparent protection layer in contact with each light output surface, the protection layer being less than about 0.05 µm thick; and
    (B) forming, on the corresponding protection layer on each light output surface, a corresponding particle layer positioned on and in contact with the corresponding protection layer, each particle layer comprising a multitude of optically scattering or luminescent particles characterized by a D50 greater than about 0.10 µm and less than about 20. µm, and a thin coating layer of transparent material coating particles of the multitude, the coating layer having a thickness less than about 0.30 µm, the protection layer including one or more materials different from material of the coating layer.

11. The method of claim 10, wherein:
    (A') the protection layer includes one or more metal or semiconductor oxides and is formed using atomic layer deposition or chemical vapor deposition using one or more corresponding protection layer oxide precursors;
    (B') the coating layer includes one or more metal or semiconductor oxides and is formed using atomic layer deposition or chemical vapor deposition using one or more corresponding coating layer oxide precursors different from the one or more protection layer oxide precursors; and
    (C) the one or more protection layer oxide precursors exhibit reactivities, with respect to the corresponding light output surface, that are less than such oxide precursor reactivities exhibited by the one or more coating layer oxide precursors.

12. The method of claim 11, wherein the oxide precursors include one or more metal or semiconductor halides, amides, alkyl amides, or alkoxides, or organometallic compounds.

13. The method of claim 10, wherein (i) material of the protection layer includes one or more materials selected from a group consisting of $HfO_2$, $SiO_2$, $Ga_2O_3$, $GeO_2$, $SnO_2$, $CrO_2$, $Nb_2O_5$, $TiO_2$, $Ta_2O_5$, $V_2O_5$, $Y_2O_3$, and $ZrO_2$, (ii) material of the coating layer includes one or more materials selected from a group consisting of $Al_2O_3$, $HfO_2$, $SiO_2$, $Ga_2O_3$, $GeO_2$, $SnO_2$, $CrO_2$, $Nb_2O_5$, $TiO_2$, $Ta_2O_5$, $V_2O_5$, $Y_2O_3$, and $ZrO_2$, and (iii) each light output surface is a GaN, AlN, AlGaN alloy, GaP, AlGaP, or AlInGaP alloy material surface.

14. The method of claim 13, wherein (i) the protection layer includes $HfO_2$, (ii) protection layer oxide precursors include one or more of tetrakis(dimethylamino)hafnium ($Hf(NMe_2)_4$), tetrakis(ethylmethylamino)hafnium ($Hf(NMeEt)_4$), or tetrakis(diethylamino)hafnium ($Hf(NEt_2)_4$), (iii) the coating layer includes $Al_2O_3$, and (iv) coating layer oxide precursors include one or more of trimethylaluminum ($Al(CH_3)_3$) or dimethylaluminum hydride ($HAl(CH_3)_2$).

15. The method of claim 10, wherein the one or more semiconductor light emitting diodes form an array of semiconductor light emitting diodes having corresponding light output surfaces, each light emitting diode (i) having transverse dimensions less than about 1.0 millimeters and (ii) being separated from adjacent light emitting diodes of the array by less than about 0.10 millimeters.

16. The method of claim 10, wherein each light emitting diode has a combined thickness of n-doped, active, and p-doped layers less than about 5 μm thick.

17. The method of claim 10, wherein the particles of the multitude include luminescent particles and each particle layer forms a corresponding phosphor wavelength conversion layer of the corresponding light emitting diode.

18. The method of claim 10, further comprising adhering to the corresponding protection layer on each light output surface, using the corresponding particle layer, a corresponding phosphor wavelength conversion layer positioned on and in contact with the corresponding particle layer.

19. The method of claim 10, wherein the coating layer material has an index of refraction matching or approximately matching an index of refraction of each light output surface.

20. The method of claim 10, wherein each corresponding protection layer and the coating layer are formed at temperatures less than about 150° C.

* * * * *